US010224192B2

(12) United States Patent
Pandurangan et al.

(10) Patent No.: US 10,224,192 B2
(45) Date of Patent: Mar. 5, 2019

(54) HIGH-SPEED LOW-NOISE ION CURRENT DETECTION CIRCUIT AND MASS SPECTROMETER USING THE SAME

(71) Applicant: ATONARP INC., Tokyo (JP)

(72) Inventors: Anand Pandurangan, San Jose, CA (US); Siva Selvaraj, San Jose, CA (US); Anoop Hegde, Milpitas, CA (US)

(73) Assignee: ATONARP INC., Tokyo (JP)

( * ) Notice: Subject to any disclaimer, the term of this patent is extended or adjusted under 35 U.S.C. 154(b) by 0 days.

(21) Appl. No.: 15/656,909

(22) Filed: Jul. 21, 2017

(65) Prior Publication Data
US 2019/0027348 A1    Jan. 24, 2019

(51) Int. Cl.
*H01J 49/02* (2006.01)
*H01J 49/00* (2006.01)
*H01J 49/42* (2006.01)
*H01J 49/08* (2006.01)

(52) U.S. Cl.
CPC ...... *H01J 49/0036* (2013.01); *H01J 49/0013* (2013.01); *H01J 49/022* (2013.01); *H01J 49/025* (2013.01); *H01J 49/08* (2013.01); *H01J 49/4215* (2013.01)

(58) Field of Classification Search
CPC .............. H01J 49/0013; H01J 49/0027; H01J 49/0031; H01J 49/006; H01J 49/022; H01J 49/025; H01J 49/08; H01J 49/4215
See application file for complete search history.

(56) References Cited

U.S. PATENT DOCUMENTS

| 6,847,036 B1 | 1/2005 | Darling et al. |
| 2005/0077897 A1* | 4/2005 | Syms ............... H01J 49/0018 324/318 |

(Continued)

FOREIGN PATENT DOCUMENTS

| JP | 5-264352 A | 10/1993 |
| WO | 96-10164 A1 | 4/1996 |

(Continued)

OTHER PUBLICATIONS

International Search Report and Written Opinion of the International Searching Authority (Forms PCT/ISA/210 and PCT/ISA/237) dated Oct. 10, 2018, by the Japanese Patent Office in corresponding International Application No. PCT/JP2018/026999. (7 pages).

*Primary Examiner* — David E Smith
(74) *Attorney, Agent, or Firm* — Buchanan Ingersoll & Rooney PC

(57) ABSTRACT

Methods and circuits for detecting an ion current in a mass spectrometer are described. A circuit and a method may involve converting, over a length of integration time, the ion current to a voltage ramp by an integrating circuit having a gain setting. The circuit and the method may also involve determining a slope of the voltage ramp. The circuit and the method may also involve determining a magnitude of the ion current based on the slope of the voltage ramp and the gain setting. The circuit and the method may further involves determining an out-of-range state based on the voltage ramp and adjusting the gain setting of the integrating circuit, or the length of integration time or both, in response to the determining of the out-of-range state.

20 Claims, 9 Drawing Sheets

(56) References Cited

U.S. PATENT DOCUMENTS

2007/0215814 A1* 9/2007 Kitchen ............ G01R 19/0061
   250/397
2014/0048683 A1* 2/2014 Soh ................. H04N 5/378
   250/208.1
2015/0129756 A1 5/2015 Fitzgerald

FOREIGN PATENT DOCUMENTS

WO 03-019206 A1 3/2003
WO 2007-118186 A2 10/2007
WO WO 2007118186 A2 * 10/2007 ............ C04B 35/01

* cited by examiner

HIGH-SPEED LOW-NOISE ION CURRENT DETECTION CIRCUIT AND MASS SPECTROMETER USING THE SAME

TECHNICAL FIELD

The present disclosure generally relates to mass spectrometers and, more particularly, to a high-speed low-noise current detection circuit and a mass spectrometer using the same.

BACKGROUND

A mass spectrometer is an instrument used in an analytical technique of mass spectrometry to analyze a composition of a sample material or a chemical specimen. Mass spectrometry is able to measure or otherwise determine, at least, relative concentrations of components (such as atoms and/or molecules) that form the specimen. The specimen, typically in gas form, is ionized by a flow of high-energy electrons, transforming atoms and/or molecules of the specimen into various kinds of ions. Each kind of the ions may have a specific mass-to-charge ratio (hereinafter "m/z"). The ionized specimen (hereinafter "ion flow") is then accelerated electrically to enter into a filter, which passes only some ions (hereinafter the "selected ions") in the ion flow that exhibit certain m/z, while blocking others. The selected ions, after passing the filter, arrive at an electrode, where charges carried by the selected ions are collected and form a current (hereinafter "ion current") that flows to a detection circuit/subsystem. The detection circuit measures the ion current, and designates a magnitude of the ion current as a representation of an abundance of a certain kind of atoms and/or molecules associated with passing ions. The filter is commonly realized by a quadrupole mass filter (QMF). The m/z of the ions that are passable by a QMF is typically determined by one or more radio-frequency (RF) and/or direct-current (DC) voltages applied to the QMF. The mass spectrometer is configured to adjust the RF and DC voltages of the QMF, thereby changing the passible ions from ions of a specific m/z to ions of a different m/z. With this process repeated for different m/z values, the relative concentrations of atoms and/or molecules that form the specimen can be revealed.

A challenging problem encountered in design and implementation of a mass spectrometer, among others, resides in how the detection circuit can accurately and efficiently detect the ion current, which may vary over a large dynamic range. Depending on the amount of the specimen (measured in, for example, numbers of mole) and the relative concentration of a specific kind of ion in the specimen, an ion current may be as large as 100 nano-ampere (nA), or $10^{-7}$ A, and as small as 10 femto-ampere (fA), or $10^{14}$ A. Namely, a dynamic range of the ion current may be as large as seven orders of magnitude, if not more. The detection circuit thus needs to be capable of detecting ion currents over this large dynamic range, which readily imposes a stringent design requirement. On top of that, detecting a minute current in the fA range imposes another stringent design requirement. Electronic circuits are subjected to various kinds of noise sources in the system they are designed to serve, and this is especially true for a mass spectrometer. At least the generation of the high-energy electron flow, the ionization of the gas specimen, the acceleration of the ion flow and the operation of the QMF all employ high-voltage, high-power and/or high-frequency oscillating voltage sources. These voltages sources could easily couple electrical noise to the sensitive detection circuits, disturbing the electrical signals therein and affecting the measurement result.

FIG. 1 depicts a schematic diagram of an ion current detection circuit 100 that is commonly used in a mass spectrometer. Detection circuit 100 includes an operational amplifier (op-amp) 110, a positive input terminal of which is connected to electrical ground. Feedback capacitor C11 is provided for feedback stability of detection circuit 100, the value of which is typically in the range of 10 femto-farad (fF) to 100 fF. Capacitor C11 is connected between an output terminal of op-amp 110 and a negative input terminal of op-amp 110. Resistors R11 and R12 are gain resistors. While resistor R11 is fixedly connected in parallel with capacitor C11, resistor R12 is configured to connect in parallel with capacitor C11 and resistor R11 when switch S12 is closed or otherwise turned on. When switch S12 is open or otherwise turned off, resistor R12 is not electrically connected with detection circuit 100 and thus does not participate in the operation of detection circuit 100. Ion current 105 that is collected on a collecting electrode of the mass spectrometer flows into detection circuit 100 through input node 101, and through resistor R11 (and resistor R12 if switch S12 is on). While flowing through resistors R11 and R12, ion current 105 is converted into output voltage (hereinafter "Vout") 115. Specifically, with R representing the total resistance between the output terminal and the negative input terminal of op-amp 110, and I representing a magnitude of ion current 105, detection circuit 100 would generate an output voltage Vout=I·R. Namely, Vout is proportional to I with a gain of R, and thus represents or otherwise corresponds to the magnitude of ion current 105. Alternatively speaking, ion current 105 can be back calculated as I=Vout/R, and interpreted as an indication of an abundance of a specific kind of ion or molecule in a specimen being analyzed by the mass spectrometer. The gain of R is programmable through switch S12, thereby providing various gain settings of detection circuit 100. For example, when S12 is open, R=R11. When S12 is closed, R=R11//R12 (the composite resistance of R11 in parallel with R12). The different gain settings may be useful for different levels of ion current 105. For example, a weaker ion current 105 may require a larger gain setting, while a stronger ion current 105 may do fine with a smaller gain setting.

In practical applications, detection circuit 100 of FIG. 1 suffers numerous limitations. First of all, it is difficult for detection circuit 100 to accurately detect a weak ion current 105. Apparently, it is not possible to detect an arbitrarily infinitesimal signal. In general, for any electronic detection circuit, there exist various sources of noise and circuit offsets that collectively determine a minimum detectable level of the detection circuit, or "noise floor", below which the detection circuit is not able to distinguish a signal intended to be detected from the noise the circuit is susceptible to. That is, when the noise floor is higher than the signal to be detected, the signal is "buried" under the noise floor and cannot be detected by the circuit. Detection circuit 100 realized in discrete electronic components typically has a noise floor of 300 micro-volts (uV) or so. With a gain setting practically limited to 6e9 (that is, 6,000,000,000) or so, the noise floor of 300 uV limits the smallest detectable ion current to be around 50 fA for detection circuit 100. That is, detection circuit 100 may not be able to detect ion current 105 if ion current 105 is around or below 50 fA. Using a gain setting higher than 6e9 would require a gain resistor that may be too large to fit into a miniaturized mass spectrometer, and/or the high-value gain resistor may need to have a larger error in resistance value, not to mention that a high-value gain resistor would become a major noise source in detection circuit 100 and significantly raise the noise floor. Thus, using a gain resistor of a higher value may not only fail to extend the detectable range of detection circuit 100 below 50 fA, but actually reversely impact the minimum detectable current level of detection circuit 100. In practical situations, however, a high-performance mass spectrometer is often required to detect an ion current as low as 10 fA or so. Detection circuit 100 is thus not able to meet the requirement.

Secondly, detection circuit 100 often suffers a slow detection process due to a long waiting period in practical detection situations. Each of waiting periods 232 and 234 shown in FIG. 2 is an example of the long waiting period, with waiting period 232 longer than waiting period 234. FIG. 2 shows graph 210, of ion current 105, and graph 220, of Vout 115, for detection circuit 100 of FIG. 1. Specifically, graph 210 shows two ion current waveforms, 212 and 214, while graph 220 shows two Vout waveforms, 222 and 224. When ion current 105 of waveform 212 is received at input node 101, a corresponding Vout of waveform 222 is generated at the output terminal of op-amp 110. Similarly, when ion current 105 of waveform 214 is received at input node 101, a corresponding Vout of waveform 224 is generated at the output terminal of op-amp 110. Each set of ion current and Vout waveforms may represent ions of a respective m/z. That is, waveforms 212 and 222 may result from ions of a specific value of m/z, while waveforms 214 and 224 may result from ions of a different value of m/z.

The reason for a possible long waiting period of detection circuit 100, as implemented in a mass spectrometer, is explained below. When the QMF is adjusted from passing ions of a first value of m/z (hereinafter "$(m/z)_1$") to passing ions of a second value of m/z, (hereinafter "$(m/z)_2$"), the transition normally results in a transient or temporary perturbation to the ion current caused by capacitive coupling from various sources in the mass spectrometer, and is often manifested as one or more large peaks or valleys, or both, in the waveform of the ion current. A measurement of the ion current during this transitional phase of peaks and valleys may result in an erroneous reading of the actual ion current of $(m/z)_2$. To get an accurate measurement of the $(m/z)_2$ ion current, the detection circuit of the mass spectrometer may need to wait until this temporary perturbation has settled. This waiting period for the ion current to settle may be a hundred times longer, or even more, than the actual measurement time after the ion current has settled. The long waiting period, during which the ion current detection would not yield representative results, drastically slows down the process of ion current detection in the mass spectrometer.

This phenomenon is clearly shown in FIG. 2, wherein each of ion current waveforms 212 and 214 and each of Vout waveforms 222 and 224 shows an initial period of peaks and valleys. For example, the QMF of the mass spectrometer may have just changed from $(m/z)_1$ to $(m/z)_2$ at time t0, resulting in waveform 212 and waveform 222 which represent the corresponding ion current 105 and Vout 115, respectively. Waveform 212 and waveform 222 have a shape similar to one another, as they are related by the gain of R as defined in the linear equation of Vout=I·R, as previously presented. Each of waveforms 212 and 222 exhibits relatively large peaks and valleys between times t0 and t3, and does not settle until time t3. Consequently, detection circuit 100 would need to wait for a waiting period 232, which has a length of (t3~t0), before giving a representative value, v2, of the ion current of $(m/z)_2$. The actual detection time for the representative value v2 is shown as detection period 242, which has a length of (t4~t3). Similarly, the QMF of the mass spectrometer may have just changed from a third value of m/z, (hereinafter "$(m/z)_3$") to a fourth value of m/z, (hereinafter "$(m/z)_4$") at time t0, resulting in waveform 214 and waveform 224 which represent the corresponding ion current 105 and Vout 115, respectively. Waveform 214 and waveform 224 also have a similar shape to one another, as they are also related by the gain of R as defined in the linear equation of Vout=I·R. Each of waveforms 214 and 224 exhibits relatively large peaks and valleys between times t0 and t1, and does not settle until time t1. Consequently, detection circuit 100 would need to wait for a waiting period 234, which has a length of (t1~t0), before giving a representative value, v4, of the ion current of $(m/z)_4$. The actual detection time for the representative value v4 is shown as detection period 244, which has a length of (t2~t1). Typically, detection periods 242 and 244, usually of a few milliseconds, may have a same length, which is deterministic by the design of the detection circuit. In contrast, waiting periods 232 and 234 may have different lengths, which tend to be less controlled or otherwise less predictable, and usually in the range of tens even hundreds of milliseconds. That is, most of the time for the ion current detection of the spectrometer is consumed by the waiting periods 232 and 234, instead of by the actual detection periods 242 and 244.

It is worth noting that in each of graphs 210 and 220 of FIG. 2, the time axis is normalized with respect to the time when an adjustment is made to the QMF of the mass spectrometer to pass ions of a different m/z value. That is, for waveforms 212 and 222, t0 represents the time when a QMF setting is changed from $(m/z)_1$ to $(m/z)_2$. Likewise, for waveforms 214 and 224, t0 represents the time when a QMF setting is changed from $(m/z)_3$ to $(m/z)_4$. Since a mass spectrometer typically has only one QMF, waveforms 212 and 222 cannot be generated at the same time as waveforms 214 and 224. The two sets of waveforms need to be generated separately at two distinctive points in time, or in "two distinctive scans" of the sample specimen. Therefore, waveforms 212 and 214 ought not to be interpreted as happening concurrently, and waveforms 222 and 224 ought not to be interpreted as happening concurrently.

It is also worth noting that noise floor 201 of detection circuit 100 is shown in graph 220 of FIG. 2. As discussed previously, a Vout 115 of a value lower than noise floor 201 will not be detected by detection circuit 100. Take waveform 224 for example. Waveform 224 may be detectable for some time during waiting period 234, as waveform 224 is higher than noise floor 201 corresponding to value Vmin, for a portion of waiting period 234. However, waveform 224 is completely below noise floor 201 after settling at t1, and thus undetectable. Namely, while detection circuit 100 is supposed to detect the representative value of v4 for Vout 115 during detection period 244, in reality detection circuit 100 is not able to detect value v4, given the fact that v4 is below Vmin. Instead, detection circuit 100 would detect Vout 115 as simply 0 volt.

When detection circuit 100 detects Vout 115 to be very small or close to 0, detection circuit 100 may attempt to increase a gain setting of detection circuit 100 to see if a larger Vout 115 can be resulted. As mentioned previously, the gain setting of detection circuit 100 is determined by the total resistance R between the output terminal and the negative input terminal of op-amp 110. By increasing the total resistance R between the output terminal and the negative input terminal of op-amp 110, a higher gain will be applied to ion current 105, and a higher Vout 115 will be resulted, which may thus become higher than noise floor 201 and become detectable by detection circuit 100.

FIG. 3 shows various waveforms of Vout 115 that correspond to a same waveform 311 of ion current 105 under various gain settings (i.e., various values of R) of detection circuit 100. Governed by the linear equation of Vout=I·R, as previously discussed, a higher gain setting results in a higher value of Vout 115. That is, waveform 322 corresponds to a higher R value than waveform 321, while waveform 323 corresponds to a higher R value than waveform 322. Likewise, waveform 323 corresponds to a higher R value than waveform 322, and waveform 324 corresponds to a higher R value than waveform 323, whereas waveform 325 corresponds to a higher R value than waveform 324.

It is worth noting that, among waveforms 321-325 of FIG. 3, only waveforms 322, 323 and 324 are detectable by detection circuit 100. As discussed above, waveform 321 is undetectable, since waveform 321 corresponds to a Vout of value v1 that is below noise floor 301 of value Vmin. In addition, waveform 325 is also undetectable, and that is because waveform 325 corresponds to a Vout of value v5 that is above saturation threshold 399 of value Vmax. Saturation threshold 399 of value Vmax represents a maximal detectable voltage of Vout 115 for detection circuit 100. When Vout 115 is above Vmax, circuit 100 may saturate and thus not function as desired (e.g., the high open-loop gain of op-amp 110 may no longer be maintained), and the linear relationship of Vout=I·R between Vout 115 and ion current 105 may not be truthfully maintained. Namely, when Vout 115 is detected to be at or above Vmax, the back calculation of I=Vout/R may no longer be valid. Both waveforms 321 and 325 are referred to as "out of range", or "OOR" in short, as they are out of the detectable range of Vout within which detection circuit 100 is designed to work properly.

A way for detection circuit 100 to move a waveform from a state of OOR into the detectable range between Vmin and Vmax is by changing the gain setting R of detection circuit 100. For example, Vout 115 may move from waveform 321 to any of the waveforms 322, 323 and 324 by increasing the total resistance R between the output terminal and the negative input terminal of op-amp 110. Similarly, Vout 115 may move from waveform 325 to any of the waveforms 322, 323 and 324 by decreasing the total resistance R between the output terminal and the negative input terminal of op-amp 110. The total resistance R may be decreased or increased by turning on or off switch S12 of FIG. 1. The change of resistance R, however, gives rise to another limitation of detection circuit 100: it is a slow process for detection circuit 100 to move from a gain setting to a different gain setting. Specifically, to provide a high gain for detecting weak ion current in the fA range, detection circuit 100 is required to use high value resistors, such as R1 and R2 of FIG. 1. The high value resistors would result in large time constants for detection circuit 100, making changing the gain setting a slow process. For example, it may take hundreds of milliseconds for Vout 115 to settle after detection circuit 100 changes the gain setting.

For the same reason, detection circuit 100 is slow to respond to a sudden surge in ion current 105. In practical operation of a mass spectrometer, occasionally there may be a dramatically high concentration of certain ions in the ion flow. The high concentration of ions may pass the QMF, causing a temporarily high level of ion current 105, or a "sudden surge". The sudden surge may temporarily saturate detection circuit 110, causing Vout 115 to enter an OOR state. Although a change in gain setting may not be required to deal with the sudden surge, as the sudden surge will eventually pass, due to the long time constants described above detection circuit 100 would be slow in recovering from the saturation and coming out the OOR state.

In addition to the limitations stated above, there are other secondary reasons why a traditional detection circuit of a mass spectrometer, such as detection circuit 100 of FIG. 1, suffers from high noise and low speed. For example, since the magnitude of ion current 105 is represented by the measured absolute value of Vout 115, detection circuit 100 requires the use of op-amp 110 that has a very high open-loop gain. Op-amp 110 that exhibits a very high open-loop gain typically suffers from a higher noise and a long recovery time from saturation.

BRIEF DESCRIPTION OF THE DRAWINGS

Non-limiting and non-exhaustive embodiments of the present disclosure are described with reference to the following figures, wherein like reference numerals refer to like parts throughout the various figures unless otherwise specified.

DETAILED DESCRIPTION

In the following description, reference is made to the accompanying drawings that form a part thereof, and in which is shown by way of illustrating specific exemplary embodiments in which the disclosure may be practiced. These embodiments are described in sufficient detail to enable those skilled in the art to practice the concepts disclosed herein, and it is to be understood that modifications to the various disclosed embodiments may be made, and other embodiments may be utilized, without departing from the scope of the present disclosure. The following detailed description is, therefore, not to be taken in a limiting sense.

Figure 1:
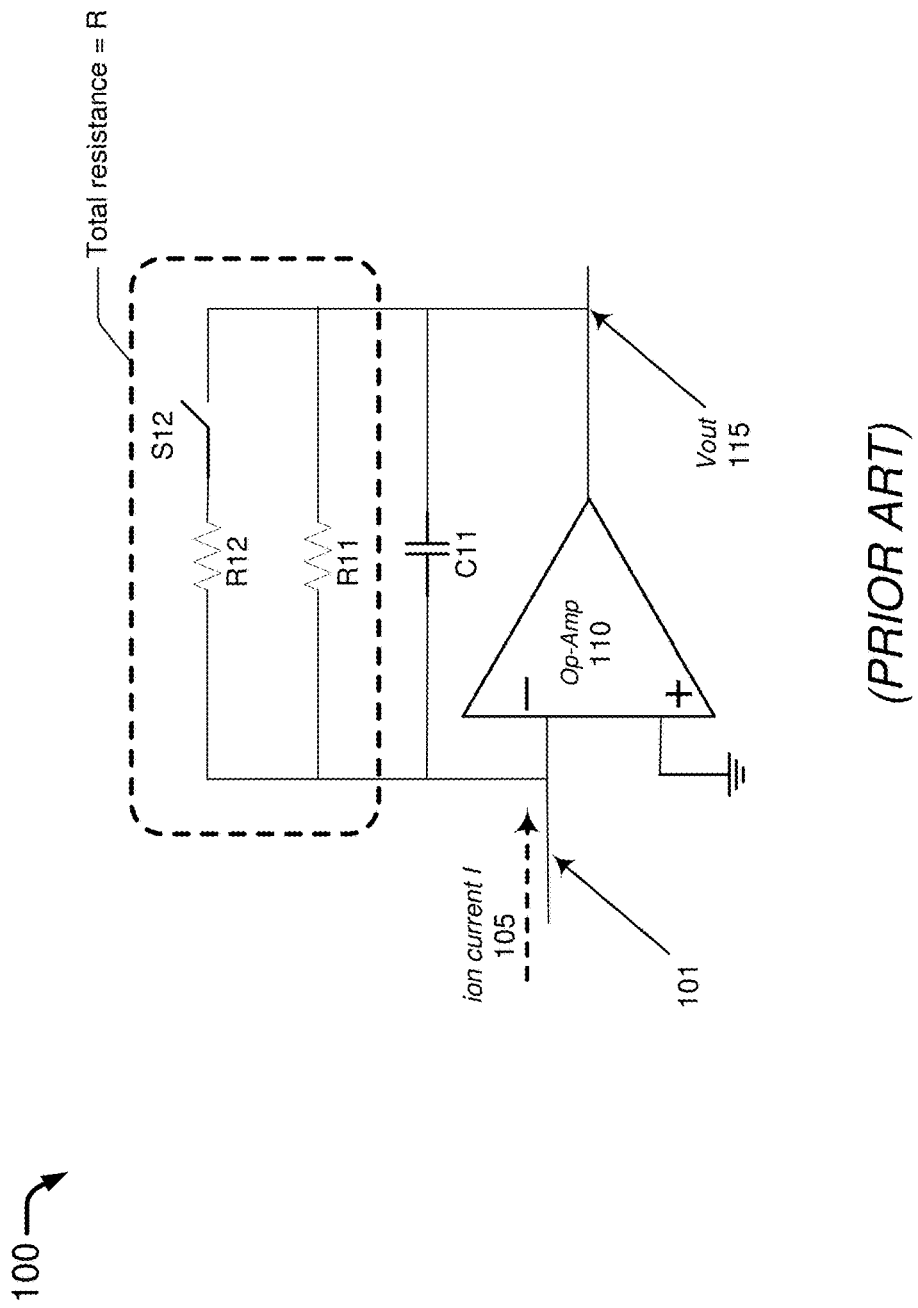
FIG. 1 is a diagram depicting a traditional ion current detection circuit implementable in a mass spectrometer.

The present disclosure aims to overcome the various limitations of the traditional ion current detection circuit 100 of FIG. 1 as discussed above. Specifically, novel detection techniques will be described in the present disclosure to provide high-speed and low-noise detection circuits specifically customized for the use of ion current detection in contemporary and next-generation mass spectrometers.

Figure 4:
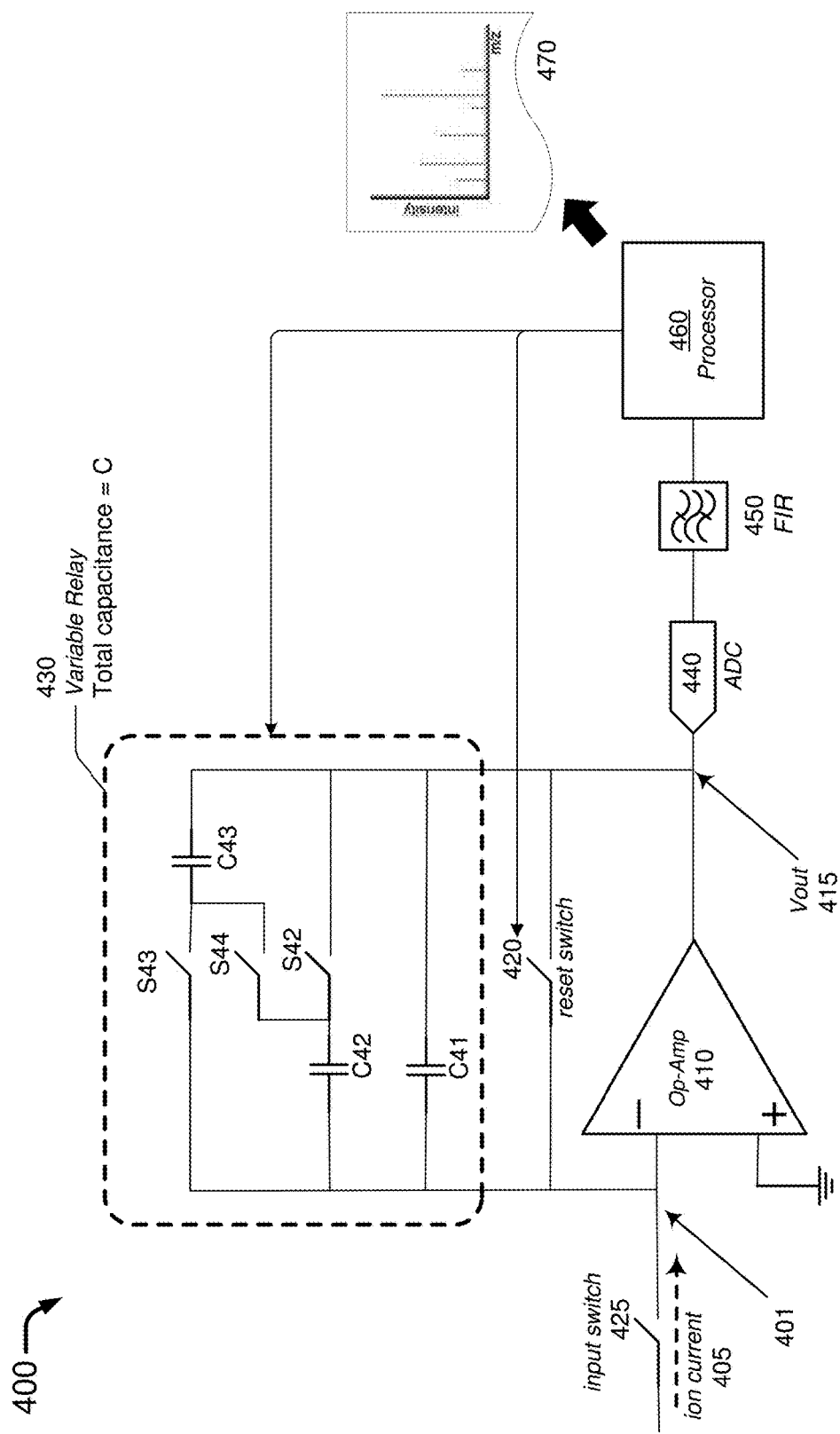
FIG. 4 is a diagram depicting an example ion current detecting circuit in accordance with an embodiment of the present disclosure.

FIG. 4 depicts a schematic diagram of a high-speed and low-noise ion current detection circuit 400 that may be implemented in a mass spectrometer. Similar to detection circuit 100 of FIG. 1, detection circuit 400 may include an op-amp 410, a non-inverting terminal of which may be connected to a reference voltage. The reference voltage may be the electrical ground of the mass spectrometer for detection circuit 400 having a single-ended configuration. Alternatively, the reference voltage may be a common-mode voltage, which may be electrically seen as a virtual ground, for detection circuit 400 having a fully differential configuration. Detection circuit 400 may also include a reset switch 420 that may be connected between an output terminal of op-amp 410 and an inverting terminal of op-amp 410 (hereinafter "the input terminal of op-amp 410"). Reset switch 420 may short-circuit the output terminal of op-amp 410 to the input terminal of op-amp 410 when reset switch 420 is closed or otherwise turned on. Detection circuit 400 may further include a variable relay 430 that may be connected between the input terminal and the output terminal of op-amp 410, in parallel with reset switch 420. Op-amp 410, reset switch 420 and variable relay 430 may collectively be referred to as an "integrating circuit" of ion current detection circuit 400. Variable relay 430 may include capacitors C41, C42 and C43 as well as switches S42, S43 and S44, and may function as a programmable or otherwise variable capacitor bank which may provide a total capacitance having a value of C between the output and input terminals of op-amp 410. Through closing or otherwise turning on one or more of switches S42, S43 and S44, the capacitance value C of variable relay 430 between the output and input terminals of op-amp 410 may be adjusted. For example, assuming each of C41, C42 and C43 has a capacitance value of $C_{unit}$, variable relay 430 may present a total capacitance of $C=C_{unit}$ when each of switches S42, S43 and S44 is open or otherwise turned off. When both S42 and S43 are turned off while S44 is turned on, variable relay 430 may present a total capacitance of $C=1.5 \cdot C_{unit}$. When S42 is turned on and both S43 and S44 are turned off, variable relay 430 may present a total capacitance of $C=2 \cdot C_{unit}$. Alternatively, with both S42 and S43 turned on and S44 turned off, variable relay 430 may present a total capacitance of $C=3 \cdot C_{unit}$. As will be clarified below, the value of C of variable relay 430 may determine a gain setting of the integrating circuit. To detect ion current 405 having a dynamic range as wide as seven orders of magnitude, variable relay 430 may provide a large range of gain settings through various on-off combinations of switches S42, S43 and S44 to program the total capacitance C of variable relay 430. Switches S42, S43 and S44 may be referred to as "range switches" for this reason.

In some embodiments, detection circuit 400 of FIG. 4 may additionally include an analog-to-digital converter (ADC) 440, one or more stages of digital filter 450 (denoted as "FIR" in FIG. 4) and a processor 460. ADC 440 may digitize a voltage ramp of Vout 415, which is an analog signal presented at the output terminal of op-amp 410, and provide digital samples that may collectively represent the voltage ramp of Vout 415. The digital samples output by ADC 440 may pass through the one or more stages of digital filter 450 before being received and analyzed by processor 460. Processor 460 may analyze the digital samples received from digital filter 450 and subsequently adjust the gain setting of variable relay 430 and/or control reset switch 420. Processor 460 may also determine a magnitude, a representation or otherwise a figure of merit 470 of ion current 405 based on the digital samples. More details regarding ADC 440, digital filter 450 and processor 460 will be given in later parts of the present disclosure.

In some embodiments, detection circuit 400 may include an input switch 425 that is controlled by processor 460 to pass or block ion current 405. Input switch 425 may be controlled in conjunction with reset switch 420 to short-circuit variable relay 430 during a reset operation of detection circuit 400. Specifically, during normal operation of detection circuit 400, processor 460 may control reset switch 420 and input switch 425 such that reset switch 420 is open (i.e., turned off) and input switch 425 is closed (i.e., turned on), so as to pass ion current 405 through variable relay 430. In contrast, during reset operation of detection circuit 400, processor 460 may control reset switch 420 and input switch 425 such that reset switch 420 is closed (i.e., turned on) and input switch 425 is open (i.e., turned off), so as to short-circuit variable relay 430 and reset Vout 415 to 0. Input switch 425 being turned off prevents ion current 405 from flowing through reset switch 420 (which may have a none-zero on-resistance) and creating an unwanted voltage drop across the output and input terminals of op-amp 410.

The integrating circuit, which includes op-amp 410, reset switch 420 and variable relay 430, may integrate ion current 405 over a period of time (hereinafter "integrating time") and convert ion current 405 to a voltage ramp at the output terminal of op-amp 410, presented as an output voltage Vout 415. Specifically, with C representing the total capacitance of variable relay 430, I representing a magnitude of ion current 405, and T representing a length of the integrating time, detection circuit 400 may generate $Vout = I \cdot T/C$. Namely, when presented on a two-dimensional plane with the x-axis being the integrating time T and the y-axis being the voltage Vout output by op-amp 410, Vout may be presented as a linear ramp of a slope of I/C. The slope of Vout may thus be proportional to I with a gain of 1/C, and thus may represent or otherwise correspond to the magnitude of ion current 405. Alternatively speaking, ion current 405 may be back calculated as $I=Vout \cdot C/T$, and interpreted as an indication of an abundance of ion or molecule having a specific m/z in a specimen being analyzed by the mass spectrometer.

ADC 440 may perform analog-to-digital conversion with precisely timed conversion-start pulses, with the pulses separated in time of 10 to 20 microseconds (us). ADC may be of 24 bits in structure, and may have an equivalent number of bits (ENOB) of 20 to 21.

After ADC 440 completes a conversion for a sample of analog input, the digitized voltage samples may pass through digital filter 450 and be received by processor 460 for further analysis. Processor 460 may determine, based on the digitized samples of Vout 415 provided by ADC 440 and passing through digital filter 450, whether Vout 415 is out of a detection range of circuit 400 (more details below). If processor 460 determines that Vout 415 is outside of the detection range, processor 460 may adjust variable relay 430 and/or the length of integrating time 505 as an effort to place Vout 415 back within the detection range of circuit 400.

Similar to detection circuit 100 of FIG. 1, detection circuit 400 of FIG. 4 may also be subject to a noise floor and a saturation threshold, which collectively define the detectable range of detection circuit for Vout 415. A properly chosen gain setting of variable relay 430 (i.e., a properly chosen total capacitance C of variable relay 430) may be needed to maintain Vout 415 within the detectable range. If processor 460 analyzes the received samples of Vout 415 and determines that Vout 415 is out of range, processor 460 may control or otherwise cause variable relay 430 to adjust the gain setting. Processor 460 may also control or otherwise cause reset switch 420 to turn on so as to reset the voltage ramp to bring Vout 415 back to zero before the integrating circuit can integrate again to build up a new voltage ramp at Vout 415 with the new gain setting of variable relay 430. The resetting of Vout 415 immediately following the gain change of variable relay 430 may be crucial for fast settling of Vout 415 after the gain change. In contrast, detection circuit 100 is not provided with a reset switch, and thus may suffer from a long settling time when the gain setting of circuit 100 is changed, as previously discussed. For comparison, detection circuit 100 may typically take hundreds of milliseconds to settle, whereas detection circuit 400 may typically take merely a millisecond or less to settle. Thus, with detection circuit 400, the detection speed can be greatly improved when a change in gain setting is involved. Likewise, a sudden surge in ion current 405, similar to the sudden surge in ion current 105 as previously discussed for detection circuit 100, may also be quickly settled by the operation of reset switch 420.

Figure 5:
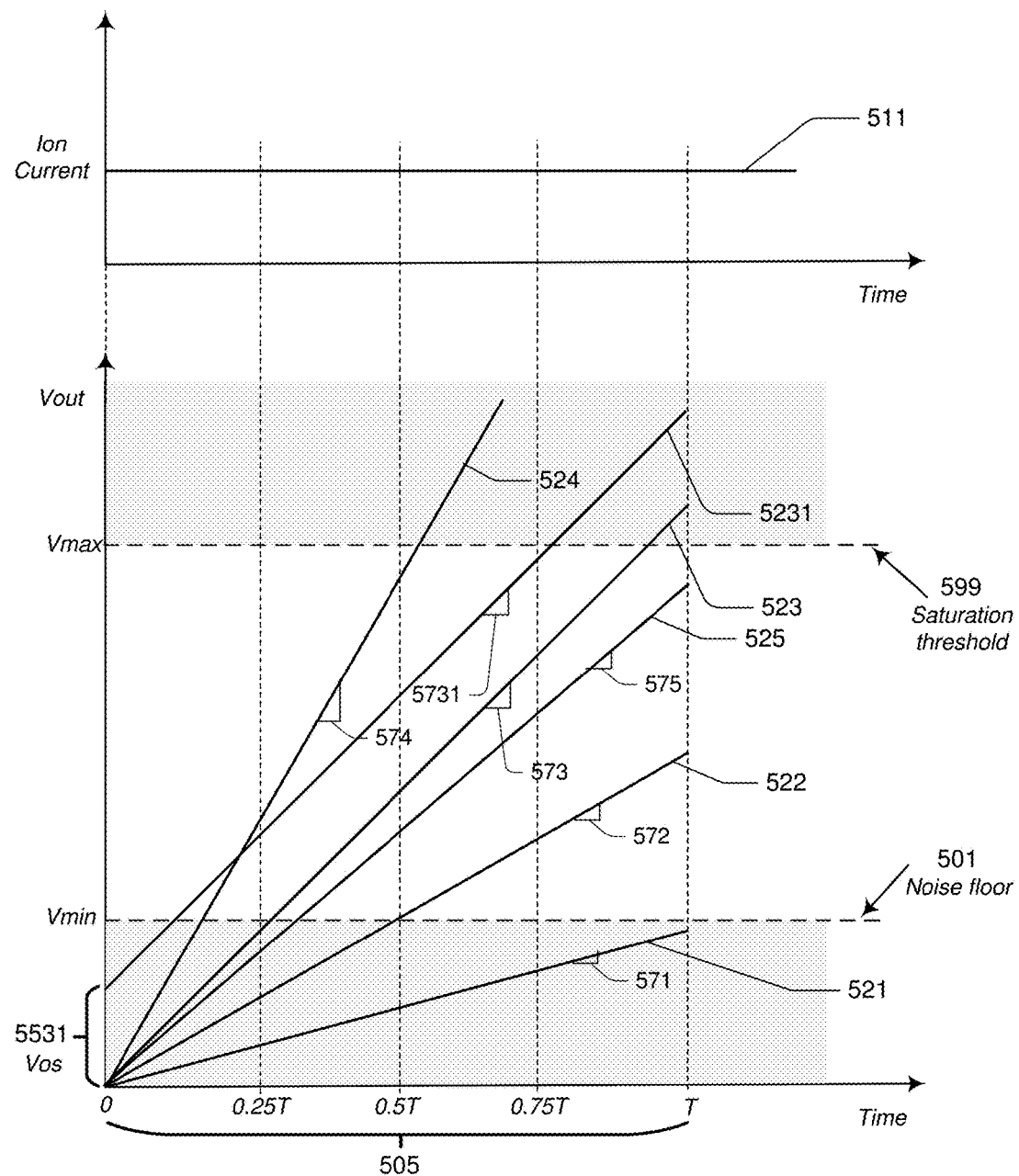
FIG. 5 is a diagram depicting a set of waveforms of various gain settings of an example ion current detecting circuit in accordance with an embodiment of the present disclosure.

FIG. 5 illustrates waveforms of Vout 415 resulted from ion current 405 of waveform 511. Ion current 405 may flow through input node 401 of detection circuit 400 and then through variable relay 430 to build up Vout 415 at the output terminal of op-amp 410. Variable relay 430 may be configured to provide one of several gain settings for detection circuit 400. Each gain setting, determined by the total capacitance C of variable relay 430, may correspond to one of several voltage ramps 521, 522, 523, 524 and 525. As explained above, the slope of each of the voltage ramps 521, 522, 523, 524 and 525 may be expressed as I/C. Therefore, for a given waveform 511 of ion current 405, the higher the capacitance value C of variable relay 430, the smaller the slope of the corresponding voltage ramp may be (e.g., less steep). For example, in FIG. 5, voltage ramp 521 corresponds to a C value higher than that corresponding to voltage ramp 522, as slope 571 of voltage ramp 521 is smaller than slope 572 of voltage ramp 522. Similarly, voltage ramp 522 corresponds to a C value higher than that corresponding to voltage ramp 523, as slope 572 of voltage ramp 522 is smaller than slope 573 of voltage ramp 523. Likewise, voltage ramp 523 corresponds to a C value higher than that corresponding to voltage ramp 524, as slope 573 of voltage ramp 523 is smaller than slope 574 of voltage ramp 524.

FIG. 5 also illustrates a noise floor 501 of value Vmin as well as a saturation threshold 599 of value Vmax, to which detection circuit 400 may be subject. Vout 415 may be higher than Vmax or lower than Vmin at the end of integrating time 505, and thus may be in an OOR state in which detection circuit 400 may fail to detect properly. As illustrated in FIG. 5, with integrating time 505 of length T, waveform 521 may be below Vmin at the end of integration and thus may be in the OOR state. On the other hand, waveforms 523 and 524 may exceed saturation threshold 599 of value Vmax at the end of integration, and may also be in the OOR state and thus undetectable. That is, with integrating time 505 set at T, detection circuit 400 may be able to detect waveforms 522 and 525 but not waveforms 521, 523 and 524, which may be out of range and undetectable. Therefore, variable relay 430 may need to be set properly to provide a suitable gain such that the voltage ramp of Vout 415 may be within the detectable range of detection circuit 400 at the end of integrating time 505.

The detectable range of detection circuit 400 is shown in FIG. 5 as the range of Vout above Vmin and below Vmax. It is possible that more than one gain setting of variable relay 430 may be able to result in a voltage ramp of Vout 415 being within the detectable range of detection circuit 400. For example, in FIG. 5, both waveform 522 having slope 572 and waveform 525 having slope 575 are within the detectable range of detection circuit 400 at the end of integrating time 505, even though waveform 525 appears to have a higher gain setting of variable relay 430 than waveform 522, as slope 575 of waveform 525 is larger than slope 572 of waveform 522. Although both within the detectable range of detection circuit 400, it is worth noting that waveform 525 is preferred over waveform 522, because Vout 415 reaches a higher value at the end of integrating time 505 on waveform 525 as compared to waveform 522. Namely, waveform 525 utilizes a larger portion of the detectable range of detection circuit 400, which makes the subsequent digitization task by ADC 440 to become easier and more accurate.

Figure 3:
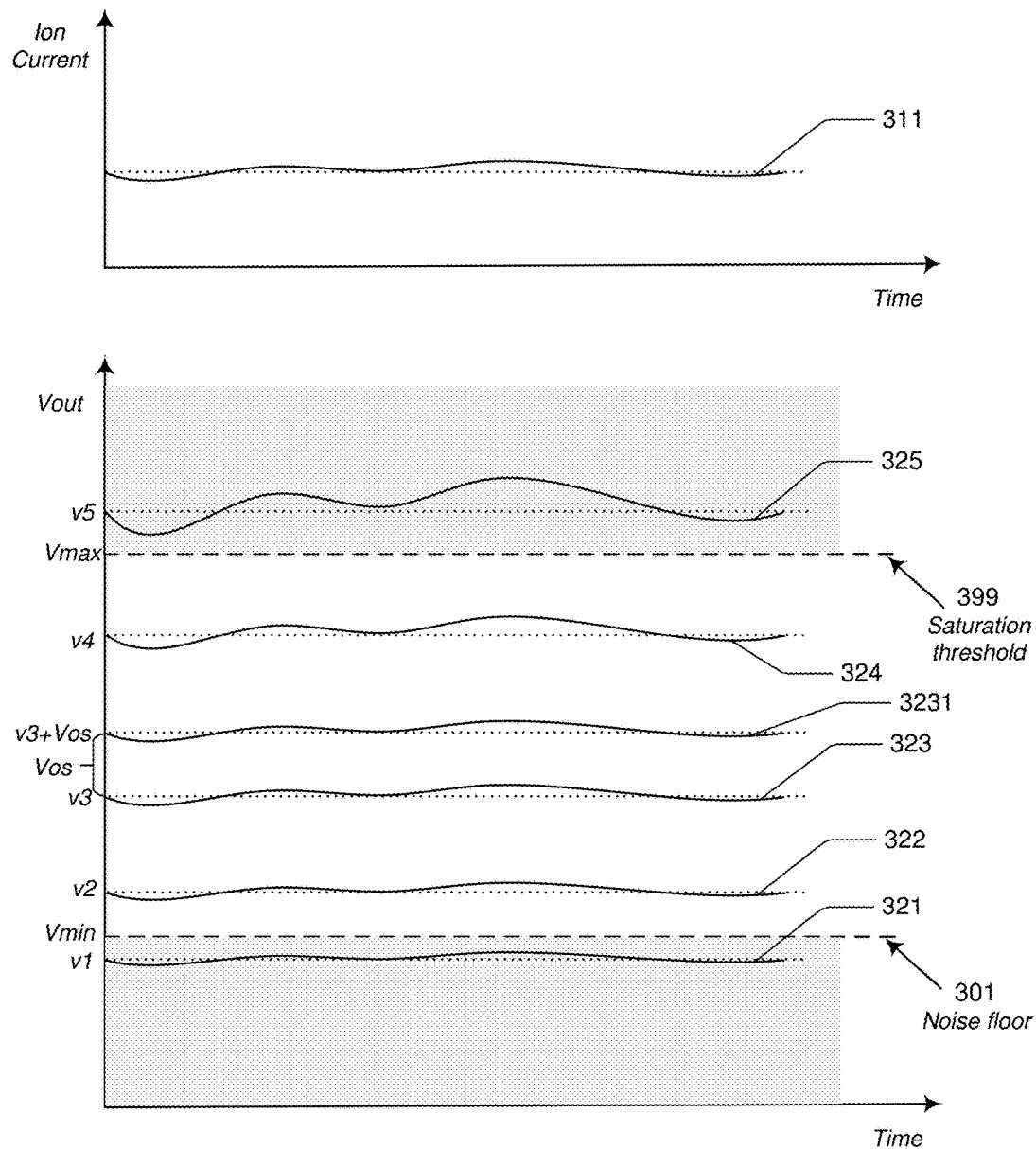
FIG. 3 is a diagram depicting waveforms of various gain settings of a traditional ion current detection circuit.

A major difference may be readily observed when detection circuit 400 according to the present disclosure is compared with traditional detection circuit 100, especially when waveforms of circuit 100 as shown in FIG. 3 are compared with waveforms detection circuit 400 as shown in FIG. 5. In particular, for detection circuit 100 an indication of the magnitude of ion current 105 resides in the absolute value of Vout 115, whereas for detection circuit 400 an indication of the magnitude of ion current 405 resides not in the absolute value of Vout 415 but, rather, in the slope of voltage ramp of Vout 415. In some embodiments, the gain setting of variable relay 430 (i.e., a relationship between the slope of voltage ramp Vout 415 and the magnitude of ion current 405) may be calibrated by passing a known current through detection circuit 400. That is, detection circuit 400 may be configured to receive a current of a known magnitude as ion current 405, and processor 460 may analyze the resulted voltage ramp Vout 415 and correlate the slope of the voltage ramp to the magnitude of the known current. The calibration may be performed for each gain setting (i.e., each capacitance configuration) of variable relay 430, and for each gain setting thereof the calibration may be performed for multiple times over which processor 460 may average to result in a more accurate calibration for the respective gain setting.

Various advantages may arise from detecting the slope of voltage ramp of Vout 415 instead of the absolute value of Vout 415. For instance, to move a waveform of Vout 415 out of the OOR state, detection circuit 400 may not have to adjust the gain setting C through variable relay 430. Instead, detection circuit 400 may choose to extend or shorten the integrating time 505 to achieve the purpose. As illustrated in FIG. 5, waveform 521 may ramp slowly due to ion current 405 being at a very low level. Although waveform 521 may remain below noise floor 501 up to integrating time T, waveform 521 may continue to ramp up with time at slope 571. Even without changing the total capacitance C of variable relay 430 (i.e., without changing gain setting of the integrating circuit of detection circuit 400), given a longer integrating time waveform 521 may exceed noise floor 501 (of value Vmin) and thus become detectable by detection circuit 400. Namely, an advantage of circuit 400 lies in a flexibility to trade a longer detection time for a capability of measuring ion current 451 of a weak value. This is especially advantageous if the gain of the integrating circuit is already at the maximum setting (i.e., total capacitance C of variable relay 430 is already at the minimum) and there is no way to increase the slope of the Vout waveform by switching to a total capacitance C of a lower value. That is, unlike detection circuit 100, a noise floor of detection circuit 400 may no longer limit how small an ion current 405 may be detected by circuit 400 as long as a sufficiently long integrating time 505 is allowed. This flexibility of trading measurement speed for measurement sensitivity is not available in detection circuit 100. Even under the assumption that noise floor 501 of detection circuit 400 remains the same as noise floor 301 of detection circuit 100, the flexibility of detection circuit 400 enables it to detect an ion current at a much lower level than can detection circuit 100, at the expense of a longer detection time. In some embodiments, detection circuit 400 may detect ion current 405 as low as 10 pico-amp (pA) within a detection time of 50 us or so.

The flexibility of trading measurement speed for measurement sensitivity is equally beneficial when ion current 405 is strong. While detection circuit 100 of FIG. 1 has a deterministic detection time as disclosed previously, detection circuit 400 of FIG. 4 may leverage a stronger ion current 405 for a shorter detection time and thus achieving a faster scan speed of the mass spectrometer. For instance, as shown in FIG. 5, it may not need to take the whole length T of integrating time 505 for processor 460 to determine slope 573 based on waveform 523. Processor 460 may determine slope 573 based on waveform 523 when integrating time 505 is shortened to 0.75 T or even 0.5 T. Namely, samples of Vout 415 of the first three-quarters or even the first half of waveform 523 may be sufficient for processor 460 to determine slope 573. The reduced integrating time may translate to a 50% or even 100% improvement in the detection speed of the ion current detection process, thereby increasing the measurement efficiency of a mass spectrometer equipped with detection circuit 400. It is worth noting that, regardless whether processor 460 determines to adjust the gain setting of variable relay 430 or integrating time 505, or both, Vout 415 may also be reset to ground at the same time through the closing and opening of reset switch 420 (and in some embodiments, input switch 425 as well which blocks or allows ion current 405), so as to provide a clean basis for a new voltage ramp at Vout 415 with the new gain setting of variable relay 430 and/or new length of integrating time 505.

Another significant benefit of detecting the slope rather than the absolute value of Vout 415 is manifested in a better immunity toward error sources such as offsets in the detection circuit 400. For instance, both detection circuits 100 and 400 may be subjected to certain amount of DC offset error. A DC offset voltage presented in circuit 100 may cause an erroneous reading in measuring ion current 105, whereas the same DC offset voltage may not cause an error in measuring the ion current 405. As illustrated in FIG. 3, a DC offset voltage Vos presented at the output terminal of op-amp 110 may shift waveform 323 to waveform 3231, causing the representative value of Vout 115 to shift from v3 to (v3+ Vos). Assuming detection circuit 100 has a 10% Vos in the positive direction (i.e., Vos=0.1·v3), the measured ion current 105 would thus be 10% higher than what it actually is, which translates to a 10% error in the relative concentration of the corresponding ions in the specimen under test. For detection circuit 400, however, a DC offset voltage Vos may not change the slope of waveform of Vout 415 and not cause an error in the measurement of ion current 405. As illustrated in FIG. 5, a DC offset voltage 5531 (of value Vos) presented at the output terminal of op-amp 410 may shift waveform 523 to waveform 5231. Nevertheless, slope 5731 of waveform 5231 remains substantially the same as slope 573 of waveform 523. Therefore, no error in the measurement is induced by the DC offset voltage 5531 of detection circuit 400.

Figure 6:
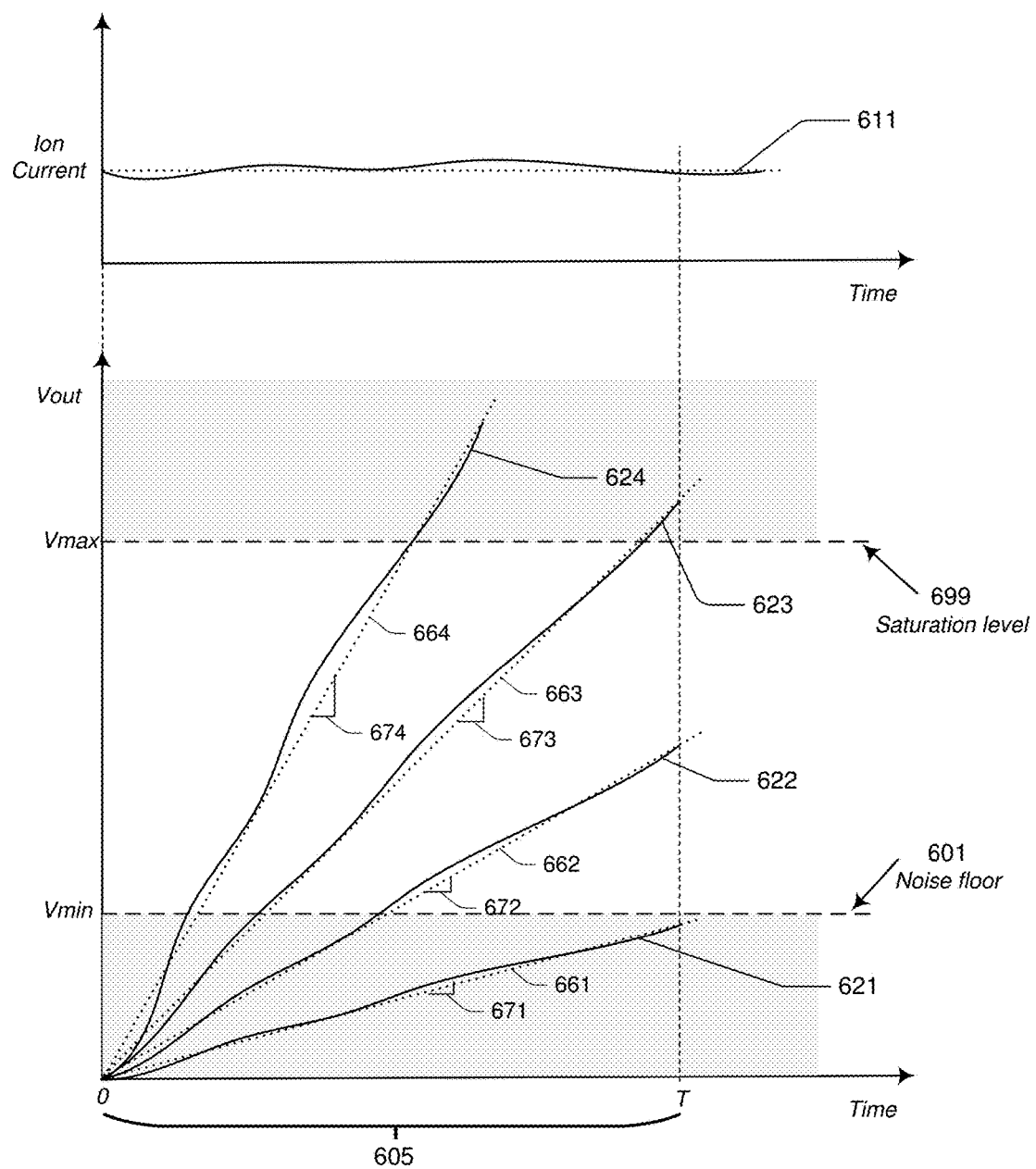
FIG. 6 is a diagram depicting another set of waveforms of various gain settings of an example ion current detecting circuit in accordance with an embodiment of the present disclosure.

As the analog voltage ramp of Vout 415 is digitized by ADC 440 before being analyzed by processor 460, various techniques may be performed in digital domain to further strengthen the immunity of detection circuit 400 to practical imperfections. FIG. 6 depicts a set of waveforms similar to those shown in FIG. 5, but with more practical details included. Compared with ion current waveform 511, ion current waveform 611 includes some fluctuations which may be resulted from capacitive couplings from various high-voltage, high-power or high-frequency sources within a mass spectrometer. Consequently, according to the governing equation of Vout=I·T/C (wherein I represents a magnitude of ion current 405, T represents a length of integrating time 605, and C represents the total capacitance of variable relay 430), Vout waveforms 621, 622, 623 and 624 may also include some fluctuations corresponding to the fluctuations in current waveform 611, with each of waveforms 621, 622, 623 and 624 corresponding to a different gain setting of variable relay 430. Take voltage ramp 624 for an example. Although the digitized samples of waveform 624 may also include fluctuations therein, the fluctuations may be reduced or otherwise removed to the first order by one or more stages of digital filter 450 that follows ADC 440. Processor 460 may process the filtered digital samples output from digital filter 450 to further reduce more non-idealities therein, resulting in a first order fitting line 664 that best approximates waveform 624 of voltage ramp at Vout 415. A slope 674 of first order fitting line 664 is then determined by processor 460 and designated as the slope of waveform 624, which in turn serves as an indication of an abundance of ion or molecule having a specific m/z in a specimen being analyzed by the mass spectrometer. In some embodiments, the measurement of a voltage ramp for a specific gain setting of variable relay 430, such as each of waveforms 621, 622, 623 and 624, may be repeated for several times, over which processor 460 may average to result in a more accurate voltage ramp of Vout 415 and thus a more accurate determination of the slope of the voltage ramp. The averaging over the multiple ramps effectively improve the signal-to-noise ratio of the resulted ion current waveform. For example, without changing the gain setting of variable relay 430, detection circuit 400 may reset (through turning on reset switch 420) to bring Vout 415 to zero, turn off reset switch 420 to capture the voltage ramp of Vout 415 for the first time, reset again to bring Vout 415 back to zero, capture the voltage ramp of Vout 415 for the second time, reset again to bring Vout 415 back to zero again, and capture the voltage ramp of Vout 415 for the third time. Processor 460 may then receive from ADC 440 the samples of the three ramps (which may or may not pass FIR 450) and average over the samples of the three ramps to achieve a more a more accurate voltage ramp of Vout 415 as well as a more accurate determination of the slope of the voltage ramp.

Figure 2:
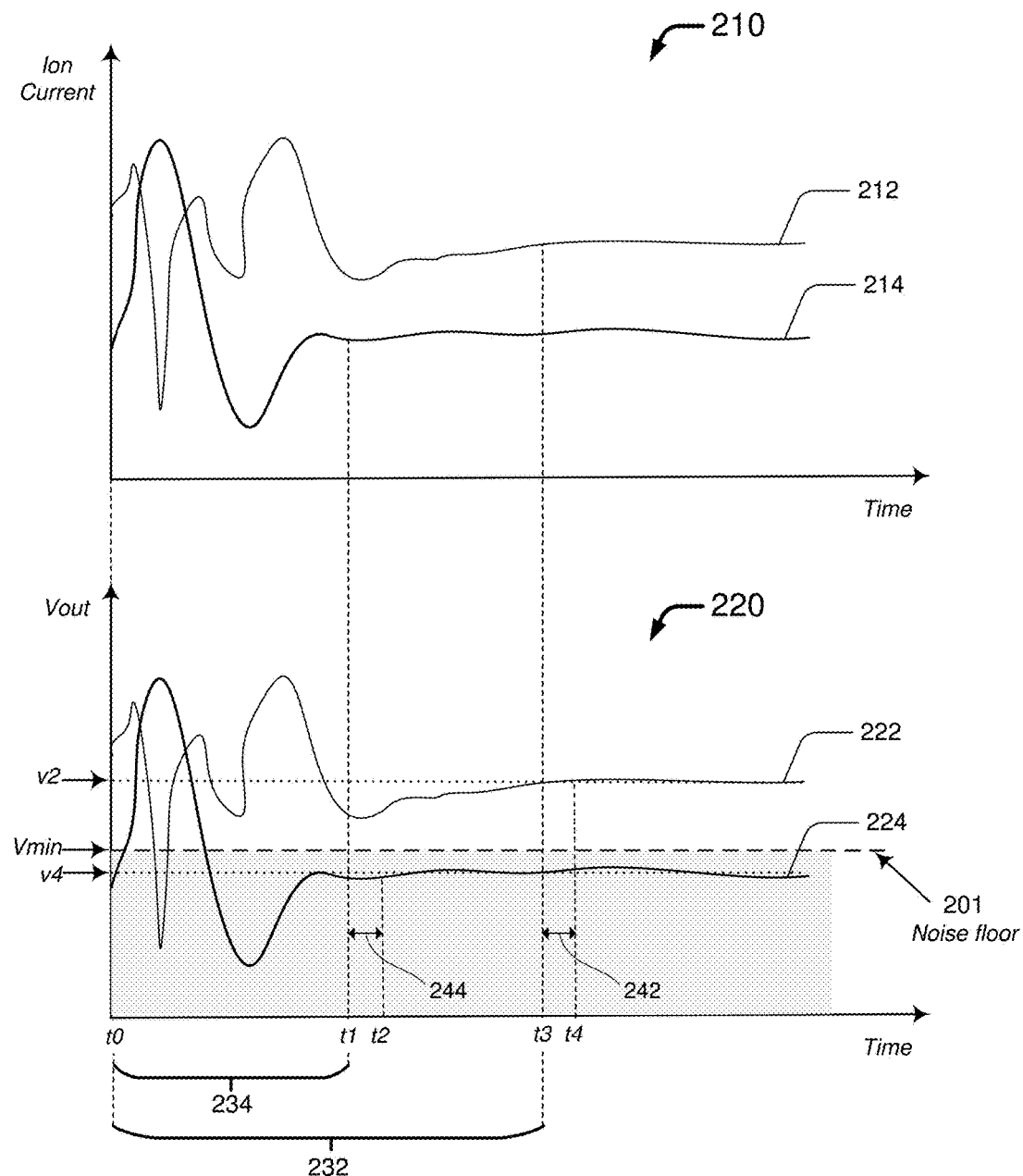
FIG. 2 is a diagram depicting input and output waveforms of a traditional ion current detection circuit.

As disclosed earlier, in some embodiments, one or more large peaks or valleys, or both, may be resulted in the ion current when a QMF of a mass spectrometer is adjusted from passing ions of a specific value of m/z to passing ions of a different value of m/z. The phenomenon has been shown in FIG. 2 as applied to detection circuit 100 of FIG. 1. Detection circuit 100 deals with this large transient perturbation to the ion current by waiting until the transient perturbation dies down. As a result, a significantly long waiting period, such as waiting periods 234 and 232, are wasted in the detection process.

Figure 7:
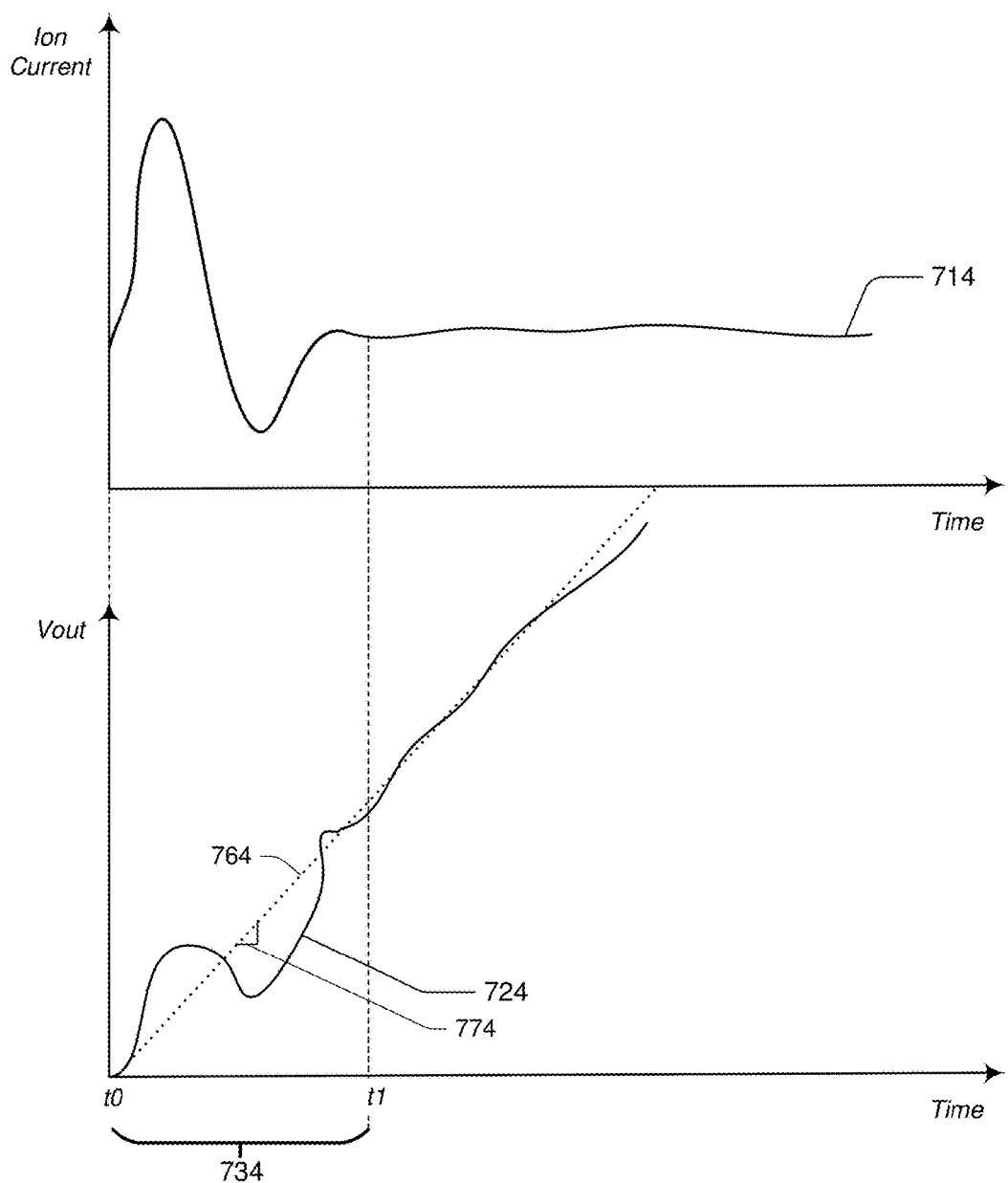
FIG. 7 is a diagram depicting input and output waveforms of an example ion current detecting circuit in accordance with an embodiment of the present disclosure.

In contrast, detection circuit 400 of FIG. 4 may have the advantage to utilize Vout waveform during the large transient perturbation to predict a slope of a first-order fitting curve that may best fit the Vout waveform after the transient perturbation has settled. FIG. 7 shows an ion current waveform 714 that is identical to ion current waveform of 214 in FIG. 2. FIG. 7 also shows Vout waveform 724 resulted from ion current waveform 714 being applied to detection circuit 400 of FIG. 4. It may take a time period 734 for ion current 714 to settle. A first-order fitting line 764 may best fit Vout waveform 724 after time t1, when the large transient perturbation between times t0 and t1 have settled. With advanced algorithms and complicated digital filtering, processor 460 may predict or otherwise extrapolate and approximate a slope 774 based on Vout waveform 724 during time period 734. That is, it is not necessary for detection circuit 400 to wait for the passage of time period 734 before obtaining a reasonably acceptable estimate of slope 774. Slope 774 estimated or approximated in this way may not be as accurate as relying on Vout waveform 724 solely after time t1, but it may give a reasonably close result which is especially beneficial when the detection result of a specimen needs to be provided promptly with no time to wait for the settling of Vout after each scan of QMF.

In addition to primary reasons presented above, detection circuit 400 may possess at least the following secondary reasons for realizing a high-speed low-noise ion current detection circuit in a mass spectrometer as compared to circuit 100. Firstly, gain settings of detection circuit 400 may be realized by capacitors and low impedance range switches, while gain settings of detection circuit 100 are realized by high-value resistors. High-value resistors are inherent noise sources, while capacitors may provide inherent noise filtering. Therefore, detection circuit 400 is intrinsically a low-noise design as compared to detection circuit 100. Secondly, due to sensitivity of offset, detection circuit 100 requires op-amp 110 to have a very high open-loop gain. An op-amp of high open-loop gain is often prone to pick up noise, and also suffers from slow recovery once the op-amp enters saturation. In contrast, op-amp 410 used in detection circuit 400 may not require a high open-loop gain, as the slope of Vout 415 is not sensitive to a DC offset voltage. Therefore, op-amp 410 may be less prone to pick up noise, and the recovery from saturation may be faster. Thirdly, noise floor 501 of FIG. 5 is inherently much lower than noise floor 301 of FIG. 3. The much-lower noise floor 501 enables the use of various signal processing/digital filtering techniques to reduce unwanted signals and random noise in digital domain. Detection circuit 100, due to a much higher noise floor 301, may not be able to leverage digital filtering or other signal processing techniques to reduce and filter out unwanted signals.

Figure 8:
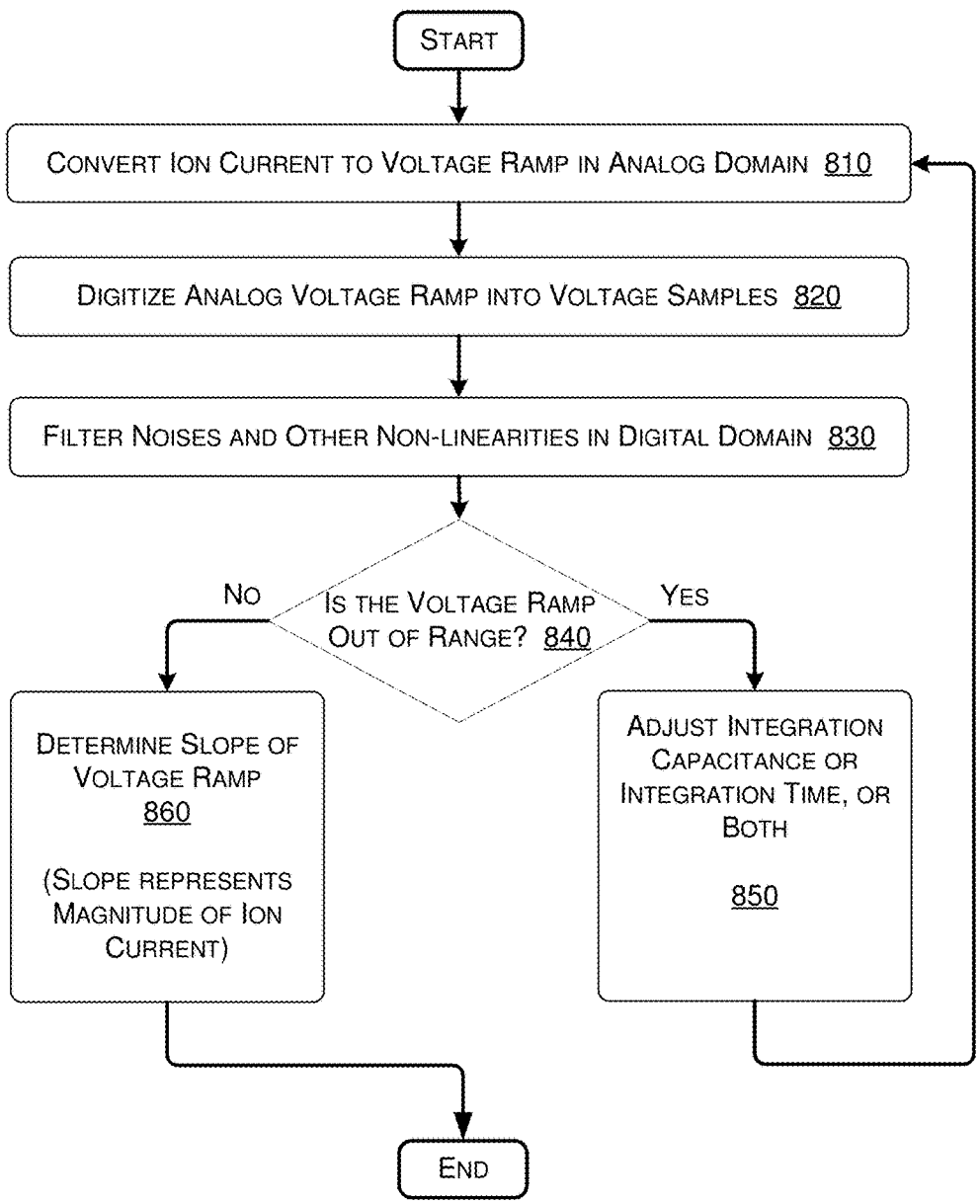
FIG. 8 is a flowchart of an example process of ion current detection in accordance with an embodiment of the present disclosure.

FIG. 8 illustrates an example process 800 for detecting an ion current in a mass spectrometer in accordance with the present disclosure. Process 800 may include one or more operations, actions, or functions shown as blocks such as 810, 820, 830, 840, 850 and 860. Although illustrated as discrete blocks, various blocks of process 800 may be divided into additional blocks, combined into fewer blocks, or eliminated, depending on the desired implementation. Process 800 may be implemented by ion current detection circuit 400. Process 800 may begin with block 810.

At 810, process 800 may involve an integrating circuit of detection circuit 400 converting an ion current into a voltage ramp in analog domain. The integrating circuit may include op-amp 410, reset switch 420 and variable relay 430 of circuit 400 in FIG. 4. The ion current may be ion current 405, and the voltage ramp may be Vout 415. The converting may happen over a length of integrating time, such as integrating time 605 of FIG. 6. Ion current 405 may have waveform 611 of FIG. 6, and Vout 415 may have waveform 621, 622, 623 or 624, depending on a gain setting of variable relay 430. Block 810 may be followed by block 820.

At 820, process 800 may involve an ADC digitizing the voltage ramp of Vout 415 from analog domain into voltage samples in digital domain. The ADC may be ADC 440 of circuit 400 in FIG. 4. The digitized voltage samples may be an equivalent representation of the voltage ramp of Vout 415 in analog domain. Block 820 may be followed by block 830.

At 830, process 800 may involve one or more digital filters connected in series to remove or otherwise reduce unwanted noise and/or other nonlinear components from the digital voltage samples. The one or more digital filters may include one or more stages of digital filter 450 of circuit 400 as shown in FIG. 4. Block 830 may be followed by block 840.

At 840, process 800 may involve a processor analyzing the digital samples that pass the one or more digital filters. The processor may be processor 460 of FIG. 4. According to the analysis of the processor, process 800 may determine whether the voltage ramp converted from the ion current by the integrating circuit is out of a detection range of process 800. For example, for Vout 415 having waveform 621 as shown in FIG. 6, process 800 may determine Vout 415 is out of range since Vout 415 has a value below noise floor 601 at the end of integrating time 605. As another example, for Vout 415 having waveform 623 as shown in FIG. 6, process 800 may determine Vout 415 is out of range since Vout 415 has a value above saturation threshold 699 at the end of integrating time 605. On the other hand, for Vout 415 having waveform 622 as shown in FIG. 6, process 800 may determine Vout 415 is not out of range since Vout 415 has a value between noise floor 601 and saturation threshold 699 at the end of integrating time 605. If process 800 determines the voltage ramp converted from the ion current by the integrating circuit is out of a detection range of process 800, process 800 may accordingly determine an OOR state to be positive. Otherwise, process 800 may determine an OOR state to be negative. Block 840 may be followed by block 850 in response to the determining of a positive OOR state. Alternatively, block 840 may be followed by block 860 in response to the determining of a negative OOR state.

At 850, process 800 may involve the processor adjusting the gain setting of the integrating circuit. For example, process 800 may involve processor 460 of FIG. 4 adjusting a total capacitance of variable relay 430 of circuit 400. Alternatively or additionally, process 800 may involve the processor adjusting the length if the integration time over which the ion current is converted to the voltage ramp. For example, process 800 may involve processor 460 of FIG. 4 reducing integration time 605 from T to 0.75 T for voltage ramp 415 having waveform 623. Block 850 may be followed by block 810.

At 860, process 800 may involve the processor determining a first-order fitting line that best represents the digitized voltage samples of the analog voltage ramp. Process 800 may further involve the processor designating a slope of the first-order fitting line as the slope of the analog voltage ramp. For example, process 800 may involve processor 460 determining first-order fitting line 662 that best fits voltage ramp waveform 622, and designating slope 672 of first-order fitting line 662 as the slope of waveform 622. Slope 672 thus may represent the magnitude of ion current 405, and may be interpreted as an indication of an abundance of ion or molecule having a specific m/z in a specimen being analyzed by the mass spectrometer. Process 800 may end at block 860.

Figure 9:
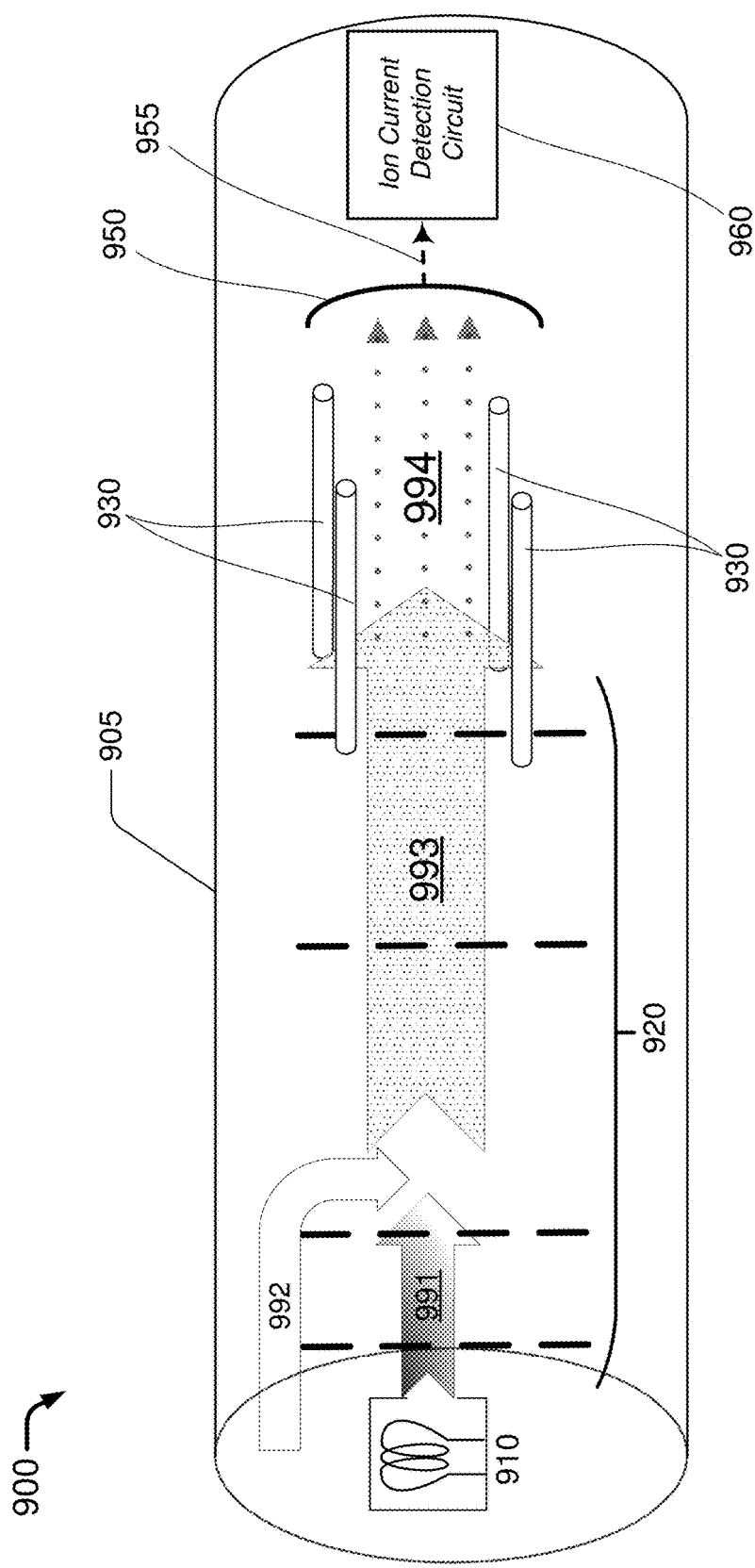
FIG. 9 is a diagram depicting an example mass spectrometer in accordance with an embodiment of the present disclosure.

FIG. 9 depicts an example miniaturized mass spectrometer 900 that may include an ion current detection circuit similar to circuit 400 of FIG. 4. Mass spectrometer 900 may include an ion drive 910. Ion drive 910 may include one or more filament heaters that may emit electrons when heated up by a filament current flowing through each of the filament heaters. The filament current is maintained with a high accuracy to minimize fluctuations in number of electrons emitted from the filament. Mass spectrometer 900 may also include an array of acceleration electrodes 920. Acceleration electrodes 920 may be used to guide and accelerate charged particles in mass spectrometer 900. Electrons emitted from ion drive 910 may be accelerated by acceleration electrodes 920, forming a high-speed electron flow 991 that flows toward an opposite end of mass spectrometer 900. High-speed electron flow 991 may encounter specimen gas molecules 992 and ionize gas molecules 992 into ion flow 993 having ionized gas molecules. Ion flow 993 may be further accelerated and guided by acceleration electrodes 920 to move toward QMF 930. QMF 930 may select to pass a portion of the ionized gas molecules 992 in ion flow 993, or selected ions 994, having a specific m/z value or a specific atomic mass unit (AMU). The selected ions 994 that pass QMF 930 may subsequently be sensed or otherwise collected by an ion sensing device 950 and formed into ion current 955 that flows into an input terminal of ion current detection circuit 960. Ion sensing device 950 may be embodied using various mechanisms, or a combination thereof. For example, ion sensing device 950 may be a Faraday cup, an ion trap, an electron multiplier, or a hybrid Faraday cup/electron multiplier. Ion current detection circuit 960 may be realized by ion current detection circuit 400 of FIG. 4. In some embodiment, mass spectrometer 900 may also include an enclosure 905 in which ion drive 910, QMF 930, ion sensing device 950 and ion current detection circuit 960 are enclosed. Enclosure 905 may be generally cylindrical in shape. Alternatively, enclosure 905 may be generally elliptical in shape or in another suitable shape.

The present disclosure provides novel methods and circuits for detecting an ion current of a mass spectrometer. Compared with traditional ion current detection circuits, the present disclosure provides means for realizing high-speed and low-noise detection for the ion current. The improved ion current detection scheme according to the present disclosure is able to greatly improve performances of the mass spectrometer.

The articles "a" and "an" are used herein to refer to one or to more than one (i.e., to at least one) of the grammatical object of the article. By way of example, "a user" means one user or more than one users. Reference throughout this specification to "one embodiment," "an embodiment," "one example," or "an example" means that a particular feature, structure, or characteristic described in connection with the embodiment or example is included in at least one embodiment of the present disclosure. Thus, appearances of the phrases "in one embodiment," "in an embodiment," "one example," or "an example" in various places throughout this specification are not necessarily all referring to the same embodiment or example. Furthermore, the particular features, structures, databases, or characteristics may be combined in any suitable combinations and/or sub-combinations in one or more embodiments or examples. In addition, it should be appreciated that the figures provided herewith are for explanation purposes to persons ordinarily skilled in the art and that the drawings are not necessarily drawn to scale.

Embodiments in accordance with the present disclosure may be embodied as an apparatus, method, or computer program product. Accordingly, the present disclosure may take the form of an entirely hardware-comprised embodiment, an entirely software-comprised embodiment (including firmware, resident software, micro-code or the like), or an embodiment combining software and hardware aspects that may all generally be referred to herein as a "circuit," "module," or "system." Furthermore, embodiments of the present disclosure may take the form of a computer program product embodied in any tangible medium of expression having computer-usable program code embodied in the medium.

The flow diagrams and block diagrams in the attached figures illustrate the architecture, functionality, and operation of possible implementations of systems, methods, and computer program products according to various embodiments of the present disclosure. In this regard, each block in the flow diagrams or block diagrams may represent a module, segment, or portion of code, which comprises one or more executable instructions for implementing the specified logical function(s). It will also be noted that each block of the block diagrams and/or flow diagrams, and combinations of blocks in the block diagrams and/or flow diagrams, may be implemented by special purpose hardware-based systems that perform the specified functions or acts, or combinations of special purpose hardware and computer instructions. These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flow diagram and/or block diagram block or blocks.

Although the present disclosure is described in terms of certain embodiments, other embodiments will be apparent to those of ordinary skill in the art, given the benefit of this disclosure, including embodiments that do not provide all of the benefits and features set forth herein, which are also within the scope of this disclosure. It is to be understood that other embodiments may be utilized, without departing from the scope of the present disclosure.

What is claimed is:

1. A method of detecting an ion current in a mass spectrometer, comprising:

converting, over a length of integration time, the ion current to a voltage ramp by an integrating circuit having a gain setting;

determining a slope of the voltage ramp by:

digitizing, by an analog-to-digital converter (ADC), the voltage ramp into a plurality of voltage samples, the plurality of voltage samples representing the voltage ramp; and analyzing, by a processor, the plurality of voltage samples to determine the slope of the voltage ramp;

determining a magnitude of the ion current based on the slope of the voltage ramp and the gain setting; and determining an out-of-range (OOR) state based on the voltage ramp and a predetermined detectable range; and adjusting the gain setting of the integrating circuit, the length of integration time, or both, in response to the determining of the OOR state such that the voltage ramp is within the predetermined detectable range at an end time of the length of integration time.

2. The method of claim 1, wherein the analyzing of the plurality of voltage samples to determine the slope of the voltage ramp comprises:
   determining a first-order fitting line based on the plurality of voltage samples; and
   designating a slope of the first-order fitting line as the slope of the voltage ramp.

3. The method of claim 1, further comprising:
   reducing, by one or more digital filters coupled in series, a noise component of the plurality of voltage samples before analyzing the plurality of voltage samples.

4. The method of claim 1, further comprising:
   repeating the converting of the ion current to the voltage ramp for multiple times, wherein:
   the plurality of voltage samples comprise multiple sets of voltage samples resulted from the repeating, and
   the analyzing of the plurality of voltage samples to determine the slope of the voltage ramp comprises averaging over the multiple sets of voltage samples.

5. The method of claim 1, further comprising:
   calibrating the gain setting of the integrating circuit by sending a calibrating current of a known value to the integrating circuit and recording the slope of the voltage ramp resulted from the calibrating current.

6. A circuit of detecting an ion current and implementable to a mass spectrometer, the circuit comprising:
   an integrating circuit having a gain setting and configured to convert the ion current to a voltage ramp over a length of integration time;
   an analog-to-digital converter (ADC) configured to digitize the voltage ramp into a plurality of voltage samples; and
   a processor configured to determine a slope of the voltage ramp based on one or more voltage samples of the plurality of voltage samples and further configured to determine a magnitude of the ion current based on the slope of the voltage ramp and the gain setting;
   wherein the integrating circuit comprises:
   an operational amplifier (op-amp) having an inverting terminal as an input terminal, a non-inverting terminal connected to a reference voltage as a ground terminal, and an output terminal, the input terminal configured to receive the ion current;
   a reset switch connected between the input terminal and the output terminal of the op-amp, the reset switch configured to short-circuit the output terminal of the op-amp to the input terminal of the op-amp when the reset switch is turned on; and
   a variable relay connected between the input terminal and the output terminal of the op-amp, the variable relay configured to provide the gain setting of the integrating circuit; and
   wherein the processor is further configured to determine an out-of-range (OOR) state based on the voltage ramp and a predetermined detectable range, and wherein the processor is further configured to adjust the gain setting of the integrating circuit and reset the voltage ramp via the reset switch according to the OOR state.

7. The circuit of claim 6, further comprising:
   one or more digital filters configured to reduce a noise component of the plurality of voltage samples and generate the one or more voltage samples of the plurality of voltage samples.

8. The circuit of claim 6, wherein the variable relay comprises: a plurality of capacitors; and
   a plurality of range switches, each of the plurality of range switches connected to at least one of the plurality of capacitors,
   wherein the plurality of range switches are configured to connect one or more capacitors of the plurality of capacitors to provide the gain setting of the integrating circuit, and
   wherein the plurality of range switches are further configured to connect one or more capacitors of the plurality of capacitors in series, in parallel, or both in series and in parallel, to adjust the gain setting of the integrating circuit.

9. The circuit of claim 6, wherein the processor is further configured to adjust the length of integration time according to the OOR state.

10. The circuit of claim 6, wherein the integrating circuit further comprises:
    an input switch configured to pass the ion current while the ion current is converted to the voltage ramp, and further configured to block the ion current while the reset switch is turned on to reset the voltage ramp.

11. A miniaturized mass spectrometer for analyzing gas molecules, comprising:
    an ion drive configured to ionize the gas molecules into an ion flow comprising a plurality of gas ions having a plurality of values of atomic mass unit (AMU);
    a quadrupole mass filter (QMF) configured to selectively pass a first part of the plurality of gas ions, each gas ion of the first part of the plurality of gas ions having a first value of AMU;
    an ion sensing device configured to sense the first part of the plurality of gas ions and generate a first ion current; and
    an ion current detection circuit configured to detect the first ion current, the ion current detection circuit comprising:
    an integrating circuit having a gain setting and configured to convert the first ion current to a voltage ramp over a length of integration time;
    an analog-to-digital converter (ADC) configured to digitize the voltage ramp into a plurality of voltage samples; and
    a processor configured to determine a slope of the voltage ramp based on one or more voltage samples of the plurality of voltage samples and further configured to determine a magnitude of the first ion current based on the slope of the voltage ramp and the gain setting;
    wherein the processor is further configured to determine an out-of-range (OOR) state based on the voltage ramp and a predetermined detectable range, and wherein the processor is further configured to adjust the gain setting of the integrating circuit, the length of integration time, or both, according to the OOR state such that the voltage ramp is within the predetermined detectable range at an end time of the length of integration time.

12. The miniaturized mass spectrometer of claim 11, wherein the ion drive comprises:
    a filament heater configured to generate a plurality of electrons; and
    one or more acceleration electrodes configured to accelerate the plurality of electrons to form a high velocity electron flow that ionize the gas molecules into the ion flow.

13. The miniaturized mass spectrometer of claim 11, wherein the ion current detection circuit further comprises:

one or more digital filters configured to reduce a noise component of the plurality of voltage samples and generate the one or more voltage samples of the plurality of voltage samples.

14. The miniaturized mass spectrometer of claim 11, wherein the integrating circuit comprises:
an operational amplifier (op-amp) having an inverting terminal as an input terminal, a non-inverting terminal connected to a reference voltage as a ground terminal, and an output terminal, the input terminal configured to receive the first ion current;
a reset switch connected between the input terminal and the output terminal of the op-amp, the reset switch configured to short-circuit the output terminal of the op-amp to the input terminal of the op-amp when the reset switch is turned on; and
a variable relay connected between the input terminal and the output terminal of the op-amp, the variable relay configured to provide the gain setting of the integrating circuit.

15. The miniaturized mass spectrometer of claim 14, wherein the variable relay comprises:
a plurality of capacitors;
a plurality of range switches, each of the plurality of range switches connected to at least one of the plurality of capacitors,
wherein the plurality of range switches are configured to connect one or more capacitors of the plurality of capacitors to provide the gain setting of the integrating circuit, and wherein the plurality of range switches are further configured to connect one or more
capacitors of the plurality of capacitors in series, in parallel, or both in series and in parallel, to adjust the gain setting of the integrating circuit.

16. The miniaturized mass spectrometer of claim 11, wherein the ion sensing device comprises a Faraday cup, an ion trap, an electron multiplier, or a combination of two or more thereof.

17. A method of detecting an ion current in a mass spectrometer, comprising: converting, over a length of integration time, the ion current to a voltage ramp by an integrating circuit having a gain setting; determining a slope of the voltage ramp by:
digitizing, by an analog-to-digital converter (ADC), the voltage ramp into a plurality of voltage samples, the plurality of voltage samples representing the voltage ramp; and
analyzing, by a processor, the plurality of voltage samples to determine the slope of the voltage ramp; and
determining a magnitude of the ion current based on the slope of the voltage ramp and the gain setting, and
wherein the analyzing of the plurality of voltage samples to determine the slope of the voltage ramp comprises:
determining a first-order fitting line based on the plurality of voltage samples; and
designating a slope of the first-order fitting line as the slope of the voltage ramp.

18. A method of detecting an ion current in a mass spectrometer, comprising: converting, over a length of integration time, the ion current to a voltage ramp by an integrating circuit having a gain setting; determining a slope of the voltage ramp by:
digitizing, by an analog-to-digital converter (ADC), the voltage ramp into a plurality of voltage samples, the plurality of voltage samples representing the voltage ramp; and analyzing, by a processor, the plurality of voltage samples to determine the slope of the voltage ramp; and
determining a magnitude of the ion current based on the slope of the voltage ramp and the gain setting, and
wherein the method further comprises:
repeating the converting of the ion current to the voltage ramp for multiple times, wherein:
the plurality of voltage samples comprise multiple sets of voltage samples resulted from the repeating, and
the analyzing of the plurality of voltage samples to determine the slope of the voltage ramp comprises averaging over the multiple sets of voltage samples.

19. A circuit of detecting an ion current and implementable to a mass spectrometer, the circuit comprising:
an integrating circuit having a gain setting and configured to convert the ion current to a voltage ramp over a length of integration time;
an analog-to-digital converter (ADC) configured to digitize the voltage ramp into a plurality of voltage samples; and
a processor configured to determine a slope of the voltage ramp based on one or more voltage samples of the plurality of voltage samples and further configured to determine a magnitude of the ion current based on the slope of the voltage ramp and the gain setting, and
wherein the integrating circuit comprises:
an operational amplifier (op-amp) having an inverting terminal as an input terminal, a non-inverting terminal connected to a reference voltage as a ground terminal, and an output terminal, the input terminal configured to receive the ion current;
a reset switch connected between the input terminal and the output terminal of the op-amp, the reset switch configured to short-circuit the output terminal of the op-amp to the input terminal of the op-amp when the reset switch is turned on; and
a variable relay connected between the input terminal and the output terminal of the op-amp, the variable relay configured to provide the gain setting of the integrating circuit, and
wherein the processor is further configured to determine an out-of-range (OOR) state based on the voltage ramp and a predetermined detectable range, and wherein the processor is further configured to reset the voltage ramp via the reset switch and adjust the length of integration time according to the OOR state.

20. A circuit of detecting an ion current and implementable to a mass spectrometer, the circuit comprising:
an integrating circuit having a gain setting and configured to convert the ion current to a voltage ramp over a length of integration time;
an analog-to-digital converter (ADC) configured to digitize the voltage ramp into a plurality of voltage samples; and
a processor configured to determine a slope of the voltage ramp based on one or more voltage samples of the plurality of voltage samples and further configured to determine a magnitude of the ion current based on the slope of the voltage ramp and the gain setting, and
wherein the integrating circuit comprises:
an operational amplifier (op-amp) having an inverting terminal as an input terminal, a non-inverting terminal connected to a reference voltage as a ground terminal, and an output terminal, the input terminal configured to receive the ion current;
a reset switch connected between the input terminal and the output terminal of the op-amp, the reset switch configured to short-circuit the output terminal of the op-amp to the input terminal of the op-amp when the reset switch is turned on;
a variable relay connected between the input terminal and the output terminal of the op-amp, the variable relay configured to provide the gain setting of the integrating circuit, and
an input switch configured to pass the ion current while the ion current is converted to the voltage ramp, and further configured to block the ion current while the reset switch is turned on to reset the voltage ramp.

* * * * *